US006097633A

United States Patent [19]
La Placa

[11] Patent Number: 6,097,633
[45] Date of Patent: Aug. 1, 2000

[54] READ CIRCUIT FOR NON-VOLATILE MEMORIES

[75] Inventor: Michele La Placa, Gravina Di Catania, Italy

[73] Assignee: STMicroelectronics S.r.l., Agrate Brianza, Italy

[21] Appl. No.: 09/182,843

[22] Filed: Oct. 29, 1998

[30] Foreign Application Priority Data

Oct. 31, 1997 [IT] Italy .................................. MI97A2458

[51] Int. Cl.[7] .................................................. G11C 16/06
[52] U.S. Cl. .................................... 365/185.21; 365/185.2
[58] Field of Search .......................... 365/185.2, 185.21, 365/185.25, 210

[56] References Cited

U.S. PATENT DOCUMENTS

| | | | |
|---|---|---|---|
| 5,396,467 | 3/1995 | Liu et al. .................................. | 365/210 |
| 5,717,640 | 2/1998 | Hashimoto .......................... | 365/189.07 |
| 5,729,492 | 3/1998 | Campardo .......................... | 365/185.21 |
| 5,757,697 | 5/1998 | Briner .................................. | 365/185.21 |
| 5,901,087 | 5/1999 | Pascucci .............................. | 365/185.21 |
| 5,946,238 | 8/1999 | Campardo et al. .................. | 365/185.2 |

*Primary Examiner*—Son Mai
*Attorney, Agent, or Firm*—Theodore E. Galanthay; David V. Carlson; Seed IP Law Group PLLC

[57] ABSTRACT

A read circuit for non-volatile memories having an array section, with a corresponding bitline, and a reference section, with a corresponding reference bitline. A differential amplifier for comparing voltage signals obtained by current/voltage conversion of a current signal of an array cell and of a reference current signal is connected to the respective bit lines. A cascode transistor for each one of the array and reference sections, each driven by a NOR logic gate; a charge transistor for the bitline and a charge transistor for the reference bitline; column decoding transistors for the array section and for the reference section; the circuit further comprising an additional transistor which is connected between the NOR gate of the array side and a node for acquiring the array voltage sent to the differential amplifier, the additional transistor increasing the speed of the process for reading the bitline when the bitline is not charged.

22 Claims, 4 Drawing Sheets

6,097,633

1

READ CIRCUIT FOR NON-VOLATILE MEMORIES

TECHNICAL FIELD

The present invention relates to a read circuit for non-volatile memories. More particularly, the invention relates to a circuit for reading the state of the cells of a non-volatile memory, such as an EPROM, EEPROM and FLASH-EEPROM, which is known as sense amplifier, of the static type.

BACKGROUND OF THE INVENTION

It is known that in the latest generations of memories there has been a reduction in power consumption and an increase in the capacity and size of memory arrays, which entail an increase in capacitive load both for the wordlines and for the bitlines.

This situation can cause reading delays and reduce the performance of the memory if measures are not taken both technologically and in the design stage. For example, the delay due to the time constant (RC) associated with the wordline can be reduced by metal strapping, so as to reduce its resistance (since the capacitance of the wordline has increased).

The delay due to the increased capacitance of the bit line can instead be reduced by increasing the dimensions of the pass transistors of the column decoder of the memory cells array and of the corresponding driving circuits, or by boosting the driving signals of the pass transistors of the column decoder. These solutions, aimed at reducing the resistance involved, have the drawback that the read circuit thus modified occupies a considerable silicon area.

SUMMARY OF THE INVENTION

The aim of the present invention is to provide a read circuit for non-volatile memories which provides an increase the speed of the memory reading process.

Within the scope of this aim, an object of the present invention is to provide a read circuit for non-volatile memories which allows to reduce the charge times of a bitline involved in a reading process.

Another object of the present invention is to provide a read circuit for non-volatile memories in which the increase in the speed of the memory reading process is achieved with a substantially negligible increase in occupied silicon area.

Another object the present invention is to provide a read circuit for non-volatile memories which is highly reliable, relatively easy to manufacture and at competitive costs.

This aim, these objects and others which will become apparent hereinafter are achieved by a read circuit for non-volatile memories having an array section, with a corresponding bitline, and a reference section, with a corresponding reference bitline. A differential amplifier for comparing voltage signals obtained by current/voltage conversion of a current signal of an array cell and of a reference current signal is connected to the bitline and reference bitline. A cascode transistor is provided for the array and the reference section, driven by a NOR logic gate. There is a charge transistor for the bitline and a charge transistor for the reference bitline. Column decoding transistors are provided for the array section and for the reference section. An additional transistor is connected between said NOR gate of the array side and a node for acquiring said array voltage sent to said differential amplifier, the additional transistor increases the speed of reading the bitline when the bitline is not charged.

2

BRIEF DESCRIPTION OF THE DRAWINGS

Further characteristics and advantages of the present invention will become apparent from the following detailed description of a preferred, but not exclusive embodiment, of the device according to the invention, illustrated only by way of non-limitative example in the accompanying drawings.

DETAILED DESCRIPTION OF THE INVENTION

Figure 1:
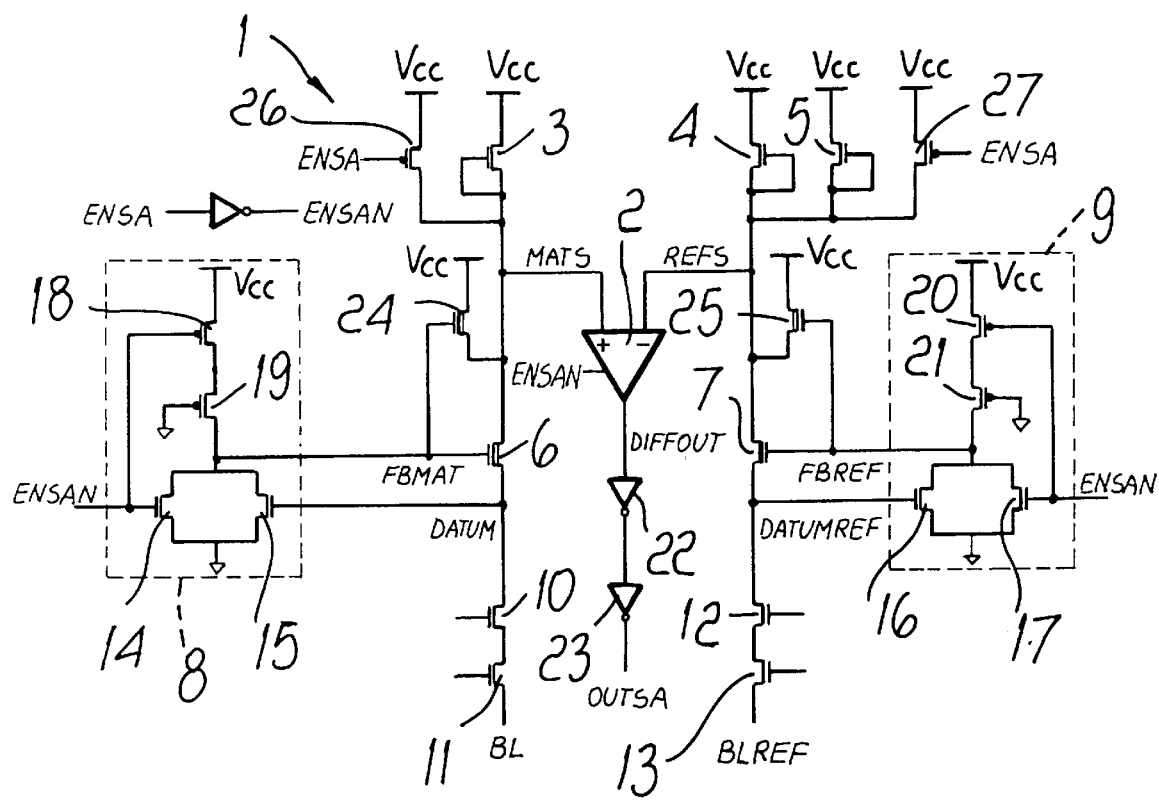
FIG. 1 is a circuit diagram of a conventional memory read circuit.

With reference to the above figures, FIG. 1 shows a circuit for reading non-volatile memories, i.e., a conventional static sense amplifier, generally designated by the reference numeral 1.

In this circuit, the currents of the array cell and of the reference cell (not shown) are compared by a differential amplifier (designated by the reference numeral 2 in FIG. 1) by using current/voltage converters with a ratio of 2 (the P-channel transistors 3, 4 and 5 have the same dimensions).

Feedback cascode circuits, constituted by transistors 6 and 7 in which the respective gate terminals are driven by respective logic gates, 8 and 9, are connected to N-channel MOS transistors 10, 11 and 12, 13, respectively for the memory cell array side and for the reference side.

The transistors 10–13 are column selection transistors for the array of memory cells and for the array of reference cells, where BL is the bitline and BLREF is the reference bitline of the reference side. These four transistors receive the column selection signals at their gate terminals.

The NOR-type gates 8 and 9 shown herein are slightly different from a normal NOR gate, which would be constituted by a pair of N-channel MOS transistors 14, 15 (for the gate 8) and 16, 17 (for the gate 9) which are parallel-connected and by a pair of P-channel MOS transistors 18, 19 (for the NOR gate 8) and 20, 21 (for the NOR gate 9) arranged in series, whereas in the NOR-type gates shown in FIG. 1 the gate terminals of the transistors 19 and 21 are connected to the ground instead of being connected so as to receive in input the signal DATUM and the reference signal DATUMREF. Of course, any acceptable logic gate, NAND, NOR, AND, etc. could be used for this inventive circuit based on the principles taught herein.

The NOR gates 8 and 9 also receive in input, in addition to the signals DATUM and DATUMREF applied to the gate terminals of the transistors 15 and 16, a signal ENSAN applied to the gate terminals of the transistors 14 and 17.

The differential amplifier 2 receives in input a pair of signals MATS and REFS, respectively from the array side and from the reference side, which are proportional to the currents of the array side and of the reference side, in order to compare them and emit a signal DIFFOUT which passes through a pair of cascade-connected inverters 22 and 23 to produce the output signal OUTSA.

The conventional read circuit is completed by a pair of N-channel MOS transistors 24 and 25, one for the array side and one for the reference side, which increase the speed of the precharging of the bitline BL and of the reference bitline BLREF.

Finally, additional P-channel MOS transistors 26 and 27 are parallel-connected to the transistors 3, 4 and 5 respectively and receive, at their gate terminals, the signal ENSA for enabling the sense amplifier. In standby conditions, the enable signal ENSA is kept low, so that the signals FBMAT and FBREF are low and the N-channel transistors 6, 7, 24 and 25 are off while the differential amplifier is not powered.

In this situation, power consumption is nil. In the above condition, since the signal ENSA is low, the P-channel transistors 26 and 27 are on and bring the nodes MATS and REFS to a voltage which is equal to the power supply Vcc.

Each one of the transistors 4 and 5 has dimensions which are equal to those of the transistor 3, so that from a resistive point of view the array side has a 2:1 ratio with respect to the reference side.

The cascode circuits (transistors 6 and 7) set the maximum voltage on the array cells and on the reference cells, so as to avoid so-called "soft writing", uncouple the output nodes from the high-capacitance nodes due to the bitlines BL and BLREF and to the column selectors (transistors 10–13), and also provide a first level of amplification.

The circuit according to the invention is now described with reference to FIG. 2, which shows that the difference with respect to the circuit shown in FIG. 1 is the presence of an additional P-channel MOS transistor 30 which is parallel-connected to the P-channel MOS transistor 19.

The gate terminal of the said P-channel MOS transistor 30 is connected to the node designated by MATS and is therefore added to the NOR gate 8.

The usefulness of the transistor 30 is apparent in the step for reading a nonprogrammed memory cell, i.e., a memory cell which is in a state of high threshold voltage (not shown in the figures) and belongs to a non-charged bitline.

Figure 3:
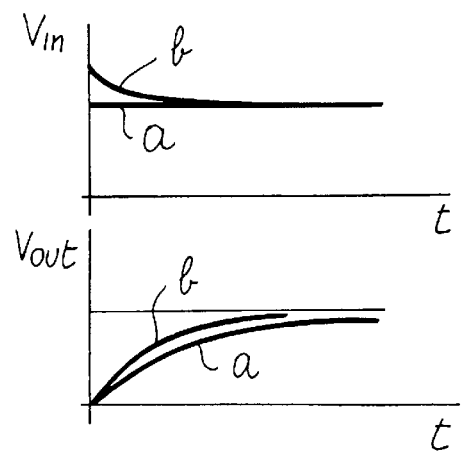
FIGS. 3 shows charts which schematically illustrates the basic principle of the present invention.

The principle on which the addition of the transistor 30 is based is the one shown in FIG. 3. As shown in the top plot of FIG. 3, graphing input voltage over time, the charging of an RC circuit performed with a signal Vin (voltage step) which is constant, designated by "a" in FIG. 3, produces an output signal Vout which has the behavior shown by the curve "a" in the bottom plot of FIG. 3.

However, if the input signal Vin had a slight overshooting, as shown by the curve "b" in the top plot of FIG. 3, the output signal Vout would have the behavior shown by the curve "b" in the bottom plot of FIG. 3, which is above curve "a" in the initial time step. In other words, the output for an input signal "b" reaches the final value sooner.

Accordingly, this concept is applied to the step for charging the bitline BL, which in practice constitutes the RC circuit, since the resistance R can be viewed as the resistance of line selection transistors 10 and 11, in addition to the resistance of the bitline BL itself, while the capacitance C can be viewed as the capacitance of the bitline BL.

The transistor 30 thus allows to achieve a slight overshoot on the node DATUM, which is common to the source terminal of the transistor 6 (which constitutes the cascode circuit) and accordingly allows to charge the bitline BL more quickly, but only if the bitline is not charged.

In this case, the gate terminal of the transistor 6, node designated by FBMAT, almost reaches the supply voltage Vcc and the transistor 24 enters the triode region. The charge current is very high and the potential of the node MATS drops below 1 volt; accordingly, the MOS transistor (of the P-channel type) is on and the operating point of the NOR gate 8 is raised.

The node FBMAT in fact reaches a higher peak value and this allows the node DATUM to charge to a value higher than the one that occurs at the end of the charge transient, i.e., the sought overshooting occurs.

The invention thus includes a method sensing data comprising precharging a sense amplifier 2, selecting an array bit line, enabling a reference bit line, coupling the array bit line to a first input of the sense amplifier by 2 driving a first switching transistor into a conduction mode with an output signal of a first logic gate 8, coupling the reference bit line to a second input of the sense amplifier 2 by driving a second switching transistor into a conducting mode with an output of a second logic gate 9, and providing an additional current path via an additional transistor 30 to the output signal of the first or second logic gate for increasing the speed of coupling the array bit line to the input of the sense amplifier.

Figure 4:
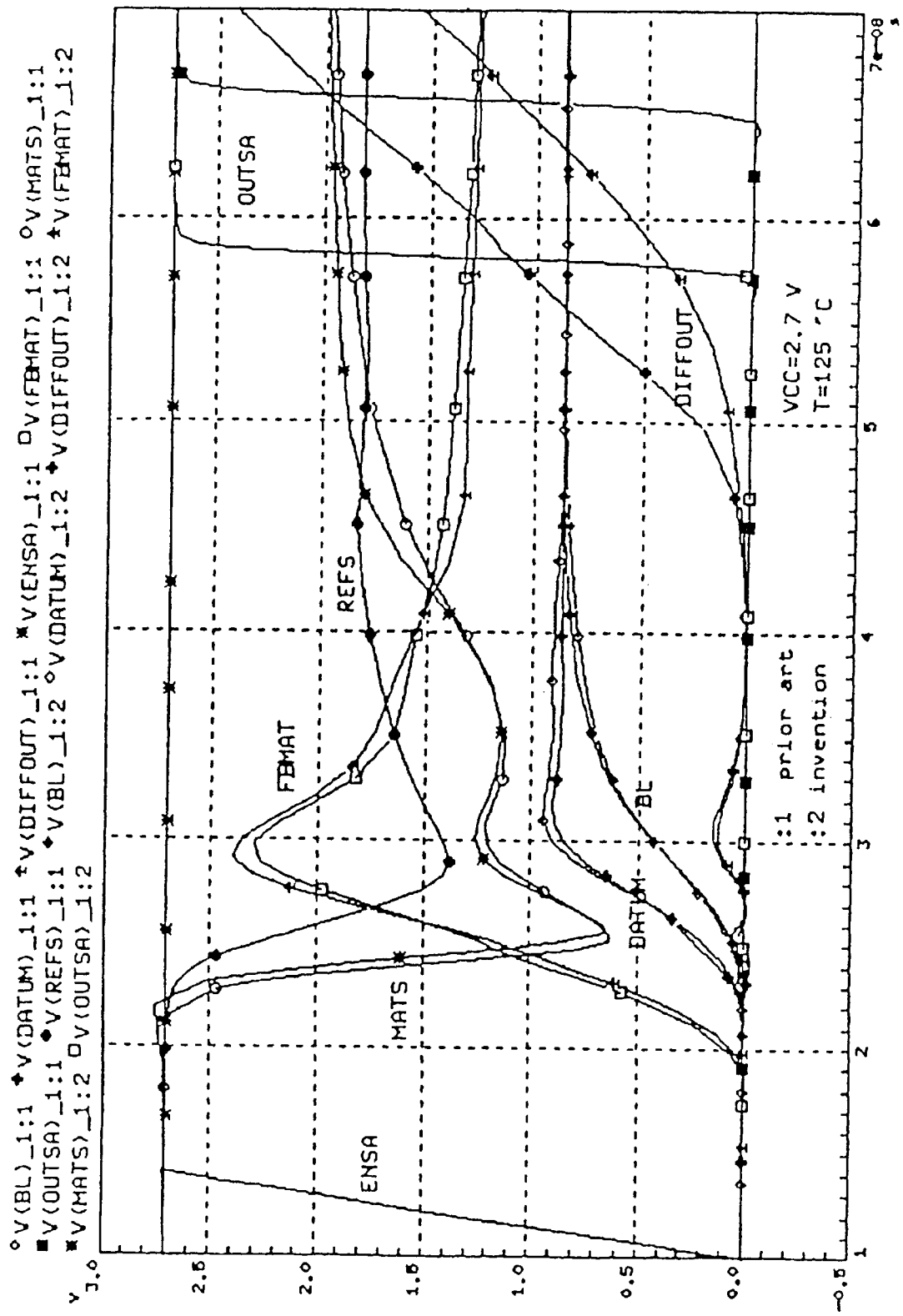
FIGS. 4 and 5 are charts of a comparison of the behavior of conventional read circuits and according to the present invention, respectively for reading a programmed memory cell and a virgin cell.
Figure 5:
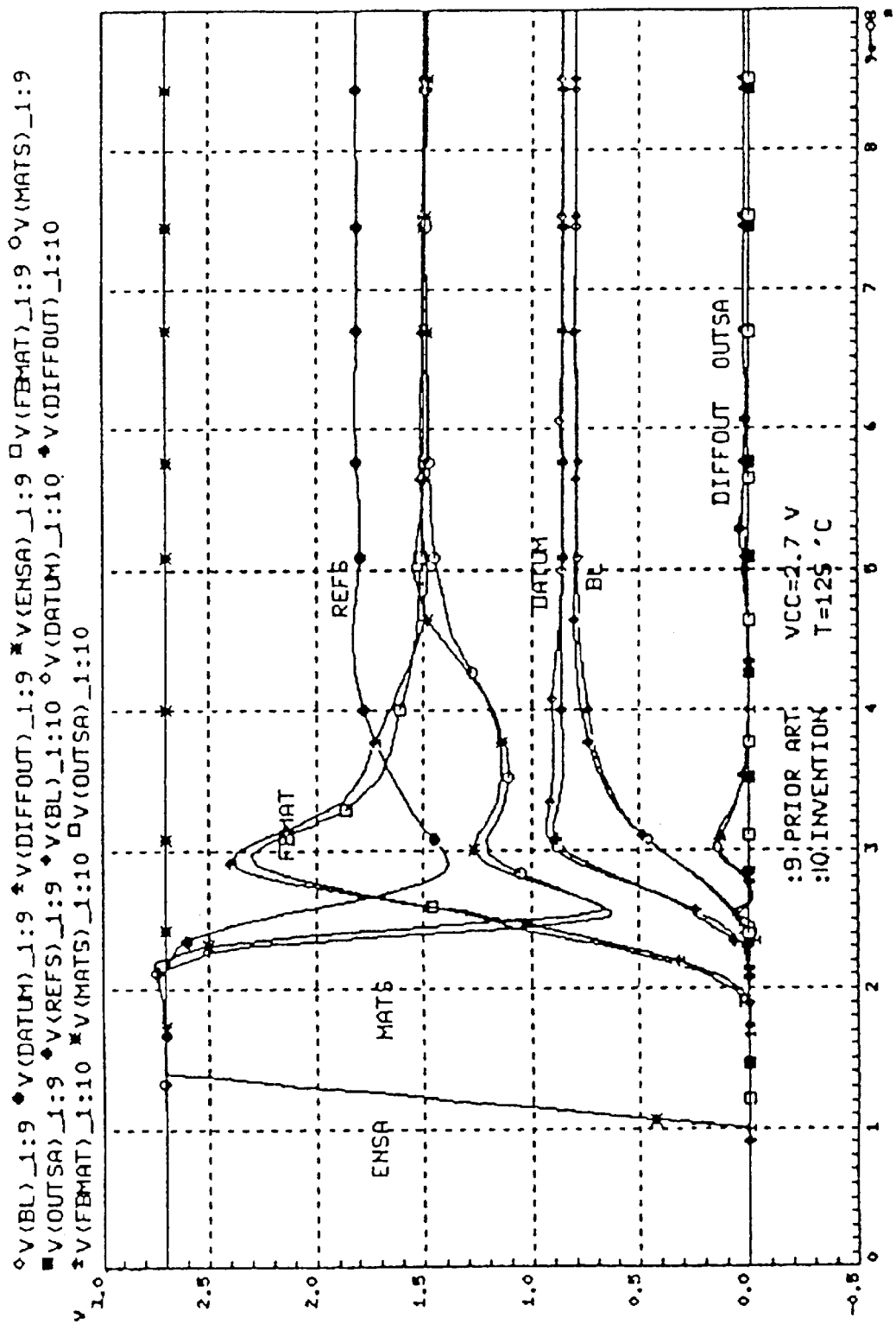

The charts of FIGS. 4 and 5 clarify the operation of the circuit according to the invention with respect to the conventional circuit.

Figure 2:
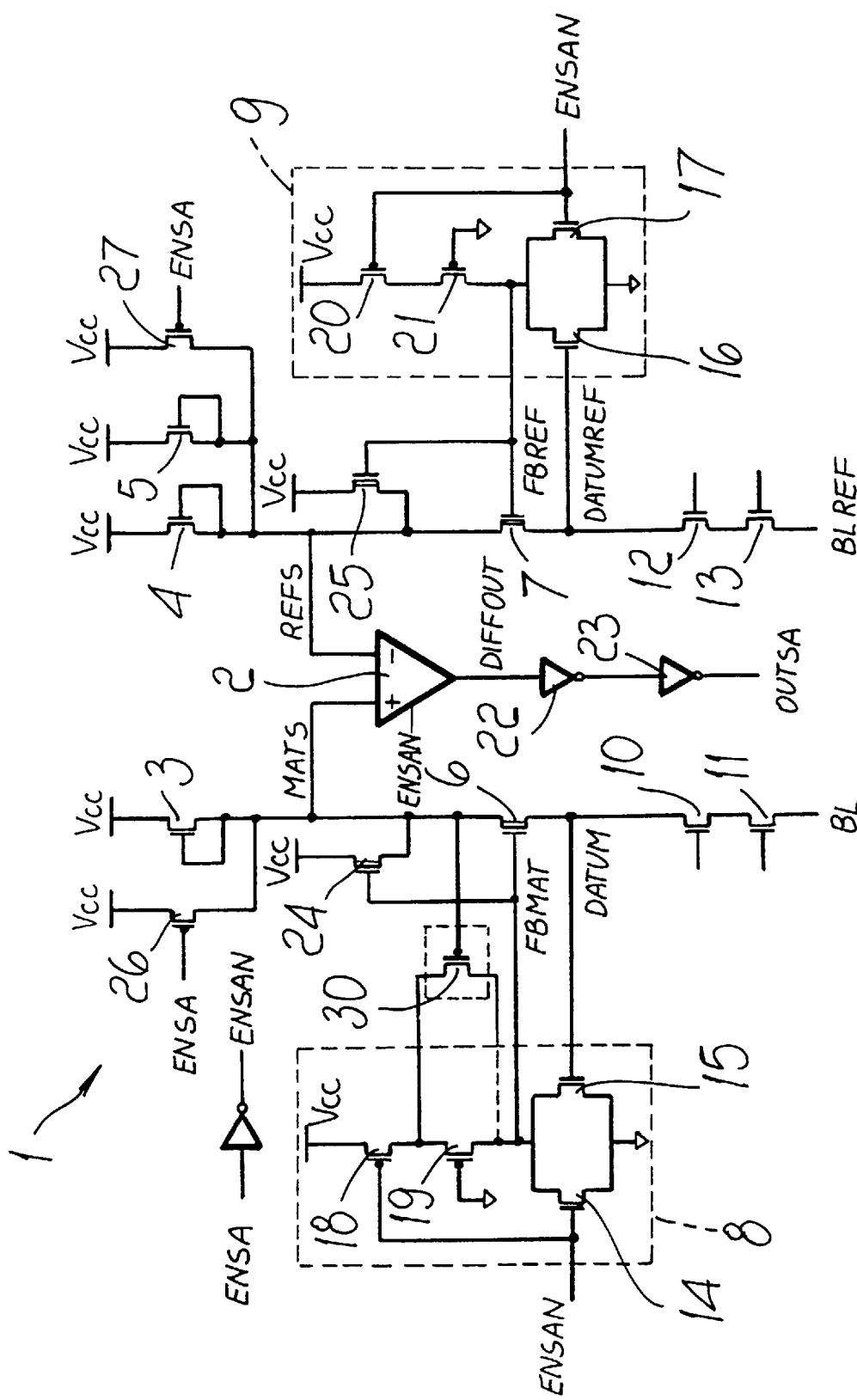
FIG. 2 is a circuit diagram of a memory read circuit according to the present invention.

In FIGS. 4 and 5, the various signals plotted are repeated for the circuit of FIG. 1 and for the circuit of FIG. 2, i.e., for the conventional circuit and for the circuit according to the present invention, in order to provide a performance comparison which is significant so as to point out the improvement to the reading process provided by the circuit according to the present invention.

Accordingly, the signals related to the circuit of FIG. 1 are designated by the reference numeral 1 followed by the name of the signal, while the signals of the circuit of FIG. 2 are designated by the reference numeral 2 followed by the name of the signal.

However, such signals are designated by the same reference signs in FIGS. 1 and 2 without adding identification numbers.

The chart of FIG. 4 shows that the bitline BL reaches, in this case, the final value more quickly than the conventional circuit of FIG. 1.

This leads to an earlier occurrence of the time when the signal MATS crosses the signal REFS and also of the time when the output of the differential amplifier switches.

It is thus evident that with the transistor 30 the reading process is faster than in the case shown in FIG. 1.

The chart of FIG. 5 instead plots the case of reading a nonprogrammed cell (low threshold voltage state) which again belongs to a non-charged bitline that must be charged initially.

In this case, the transistor 30 has no effect on the operating speed, which is of course higher than the preceding one (chart of FIG. 4).

Moreover, the transistor 30 does not influence the levels of the signals in the steady state; this is why it does not intervene when reading a bitline BL which has remained charged after a previous reading.

In practice it has been observed that the circuit for reading non-volatile memories according to the invention fully achieves the intended aim and objects, since it allows faster reading of a non-charged bitline with a practically negligible silicon area consumption and without adverse effects on the other conditions in which the bitline may be.

Since the connection of the transistor 30 introduces a new feedback path in the array side, to avoid instability problems it is desired for the designer to select appropriate dimensions for the transistor 30, and also control the phase margin so as to always be in a stable condition. Such selections are well known and once the disclosure of this invention is provided, can easily be done by one of skill in the art.

The circuit according to the present invention is particularly suitable for reading high-density non-volatile memories with a low supply voltage.

The circuit for reading non-volatile memories thus conceived is susceptible of numerous modifications and variations, all of which are within the scope of the inventive concept; all the details may also be replaced with other technically equivalent elements.

In practice, the materials employed, so long as they are compatible with the specific use, as well as the dimensions, may be any according to requirements and to the state of the art.

Of course, the transistor 30 to provide the additional current path could instead be provided in reference bit line and operate on similar principles with respect to the reference bit line.

The disclosures in Italian Patent Application No. MI97A002458 from which this application claims priority are incorporated herein by reference.

What is claimed is:

1. A read circuit for non-volatile memories, comprising:
   an array section, with a corresponding bitline, and a reference section, with a corresponding reference bitline;
   a differential amplifier for comparing voltage signals obtained by current/voltage conversion of a respective current signal of an array cell and of a reference current signal;
   a cascode transistor for each one of said array and reference sections, each driven by a logic gate;
   a charge transistor for said bitline and a charge transistor for said reference bitline;
   column decoding transistors for said array section and for said reference section; and
   an additional transistor which is connected between said logic gate of the array section and a node for acquiring said array voltage signal sent to said differential amplifier for comparison with the reference voltage converted current signal, said additional transistor increasing the speed of the process for reading said bitline when said bitline is not charged.

2. The read circuit for non-volatile memories according to claim 1 wherein said additional transistor is a P-channel MOS transistor.

3. The read circuit according to claim 1 wherein said logic gates are NOR gates.

4. The read circuit for non-volatile memories according to claim 1 wherein each one of said NOR gates is connected between a power supply line and ground and comprises a pair of P-channel MOS transistors which are arranged in series and are connected to a pair of N-channel MOS transistors which are arranged in parallel, one of said P-channel MOS transistors receiving in input an inverted signal for enabling said reference amplifier and one of said N-channel MOS transistors receiving in input a reading datum signal, a gate terminal of the other one of said P-channel MOS transistors being connected to the ground.

5. The read circuit for non-volatile memories according to claim 4 wherein said additional transistor is parallel-connected to said P-channel MOS transistor, whose gate terminal is connected to the ground.

6. The read circuit for non-volatile memories according to claim 1 wherein said node for acquiring the voltage signal that is proportional to the array current to which the gate terminal of said additional transistor is connected is arranged so that it is connected to a node for sending a voltage signal which is sent to the differential amplifier and is generated by at least one of the current/voltage converter transistors.

7. The circuit according to claim 1 wherein the additional transistor is disabled once sensing is complete.

8. A read circuit for a memory comprising:
   an array of memory cells;
   an array bit line coupled to memory cells in the array;
   a sense amplifier having a first input and a second input;
   a first coupling transistor coupled to the array bit line and to the first input of the sense amplifier;
   a first logic gate having its output coupled to drive a control terminal of the first coupling transistor;
   a reference memory cell;
   a reference bit line coupled to the reference memory cell;
   a second coupling transistor coupled to the reference bit line and to the second input of the sense amplifier;
   a second logic gate having its output coupled to drive a control terminal of the second coupling transistor; and
   an additional transistor having a control gate coupled to an input to the sense amplifier and providing an additional current path to the output of the first or second logic gate when the transistor is enabled.

9. The circuit according to claim 8 wherein said additional transistor has its control gate coupled to the first input and provides an additional current path to the output of the first logic gate.

10. The circuit according to claim 8 wherein said additional transistor has its control gate coupled to the second input and provides an additional current path to the output of the second logic gate.

11. The circuit according to claim 8 wherein the logic gate is a NOR gate.

12. The circuit according to claim 8 wherein the additional transistor is disabled once sensing is complete.

13. The circuit according to claim 8, further including pull-up transistors coupled to the inputs of said sense amplifier.

14. A method sensing data comprising:
   precharging a sense amplifier;
   selecting an array bit line;
   enabling a reference bit line;
   coupling the array bit line to a first input of the sense amplifier by driving a first switching transistor into a conducting mode with an output signal of a first logic gate;
   coupling the reference bit line to a second input of the sense amplifier by driving a second switching transistor into a conducting mode with an output of a second logic gate; and
   providing an additional current path to the output signal of the first or second logic gate for increasing the speed of coupling the array bit line to the input of the sense amplifier.

15. The method according to claim 14, further including:
   turning the first switching transistor off when the bit line reaches a logic one value.

16. The method according to claim 14 wherein said first logic gate is a NOR gate.

17. The method according to claim 14, further including disabling the additional current path after the sense amplifier had completed the sensing of the selected array bit line.

18. A read circuit for non-volatile memories further comprising:
- an array section, with a corresponding bitline, and a reference section, with a corresponding reference bitline;
- a differential amplifier for comparing voltage signals obtained by current/voltage conversion of a current signal of an array cell and of a reference current signal;
- a cascade transistor for each one of said array and reference sections, each driven by a logic gate;
- a charge transistor for said bitline and a charge transistor for said reference bitline;
- column decoding transistors for said array section and for said reference section; and
- an additional transistor which is connected between said logic gate of the array section and a node for acquiring said array voltage signal sent to said differential amplifier for comparison with the reference voltage converted current signal, said additional transistor increasing the speed of the process for reading said bitline when said bitline is not charged; and
- current/voltage converter transistors arranged at said reference section and at said array section, said converter transistors being twice as many as the converter transistors of said array section.

19. The read circuit for non-volatile memories according to claim 18 wherein said additional transistor is a P-channel MOS transistor.

20. The read circuit according to claim 19 wherein said logic gates are NOR gates.

21. The read circuit for non-volatile memories according to claim 18 wherein said node for acquiring the voltage signal that is proportional to the array current to which the gate terminal of said additional transistor is connected is arranged so that it is connected to a node for sending a voltage signal which is sent to the differential amplifier and is generated by at least one of the current/voltage converter transistors.

22. The circuit according to claim 18 wherein the additional transistor is disabled once sensing is complete.

* * * * *